(12) United States Patent
Ichikawa et al.

(10) Patent No.: US 9,991,434 B2
(45) Date of Patent: Jun. 5, 2018

(54) SEMICONDUCTOR DEVICE WITH METAL-BONDED HEAT DISSIPATOR AND MANUFACTURING METHOD FOR THE SAME

(71) Applicant: NICHIA CORPORATION, Anan-shi, Tokushima (JP)

(72) Inventors: Masatsugu Ichikawa, Tokushima (JP); Satoshi Shichijo, Tokushima (JP); Takehito Shimatsu, Natori (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days. days.

(21) Appl. No.: 14/976,702

(22) Filed: Dec. 21, 2015

(65) Prior Publication Data
US 2016/0190417 A1     Jun. 30, 2016

(30) Foreign Application Priority Data

Dec. 25, 2014  (JP) ................................. 2014-263577

(51) Int. Cl.
*H01L 33/00* (2010.01)
*H01L 27/15* (2006.01)
(Continued)

(52) U.S. Cl.
CPC .............. *H01L 33/64* (2013.01); *C04B 37/00* (2013.01); *H01L 24/29* (2013.01); *H01L 24/30* (2013.01);
(Continued)

(58) Field of Classification Search
CPC ........ H01L 2224/05644; H01L 33/64–33/642; H01L 2224/05639
See application file for complete search history.

(56) References Cited

U.S. PATENT DOCUMENTS 9,209,596 B1 * 12/2015 McLaurin ........... H01L 29/2003
2003/0020161 A1 * 1/2003 Saitoh ................. H01S 5/02272
257/706
(Continued)

FOREIGN PATENT DOCUMENTS

JP      2008-207221 A     9/2008
JP      2009-194275 A     8/2009
(Continued)

OTHER PUBLICATIONS

Higurashi, Eiji, et al. "Low-temperature bonding of laser diode chips on silicon substrates using plasma activation of Au films." IEEE Photonics Technology Letters 19.24 (2007): 1994-1996.*

*Primary Examiner* — Victor A Mandala
*Assistant Examiner* — Regan J Rundio
(74) *Attorney, Agent, or Firm* — Foley & Lardner LLP

(57) ABSTRACT

A semiconductor device includes an insulating substrate, a semiconductor element disposed on an upper surface of the substrate, a heat dissipation member, and a metal bonding layer that bonds the lower surface of the substrate to the upper surface of the heat dissipation member, and the area of the upper surface of the heat dissipation member is larger than the area of the lower surface of the substrate, and the metal bonding layer contacts the whole of the lower surface of the substrate and has an area larger than the area of the lower surface of the substrate, and the heat conductivity of the metal bonding layer is higher than the heat conductivity of the heat dissipation member.

16 Claims, 11 Drawing Sheets

(51) Int. Cl.
*H01L 33/64* (2010.01)
*H01L 21/00* (2006.01)
*H01L 23/00* (2006.01)
*C04B 37/00* (2006.01)
*H01L 23/373* (2006.01)

(52) U.S. Cl.
CPC .............. *H01L 24/32* (2013.01); *H01L 24/33* (2013.01); *H01L 33/641* (2013.01); *H01L 33/644* (2013.01); *H01L 23/3735* (2013.01); *H01L 23/3736* (2013.01); *H01L 33/0079* (2013.01); *H01L 2224/05639* (2013.01); *H01L 2224/05644* (2013.01); *H01L 2924/01047* (2013.01); *H01L 2924/01079* (2013.01)

(56) References Cited

U.S. PATENT DOCUMENTS

| | | | | |
|---|---|---|---|---|
| 2005/0040212 | A1* | 2/2005 | Yang | H01L 33/0079 228/254 |
| 2007/0290215 | A1* | 12/2007 | Kato | H01L 33/0079 257/79 |
| 2010/0123164 | A1* | 5/2010 | Suehiro | F21V 5/043 257/99 |
| 2010/0157629 | A1 | 6/2010 | Yoshikawa | |
| 2010/0158059 | A1 | 6/2010 | Yoshikawa | |
| 2010/0183896 | A1* | 7/2010 | Liu | B23K 20/24 428/647 |
| 2013/0206821 | A1 | 8/2013 | Saito et al. | |
| 2013/0306999 | A1* | 11/2013 | Sakaguchi | H01L 33/62 257/89 |
| 2014/0203296 | A1* | 7/2014 | Sugawara | H01L 33/0079 257/76 |
| 2016/0024678 | A1* | 1/2016 | Chen | C25D 5/18 428/672 |

FOREIGN PATENT DOCUMENTS

| | | |
|---|---|---|
| JP | 2010-046696 A | 3/2010 |
| JP | 2010-166019 A | 7/2010 |
| JP | 2011-235300 A | 11/2011 |
| JP | 2012-223792 A | 11/2012 |
| JP | 2013-055218 A | 3/2013 |
| JP | 2014-221492 A | 11/2014 |
| WO | WO 2012/042907 A1 | 4/2012 |

* cited by examiner

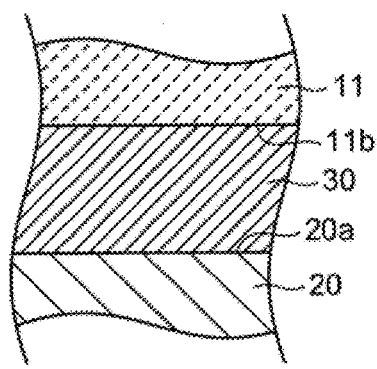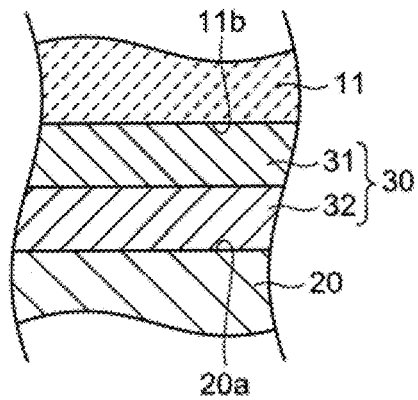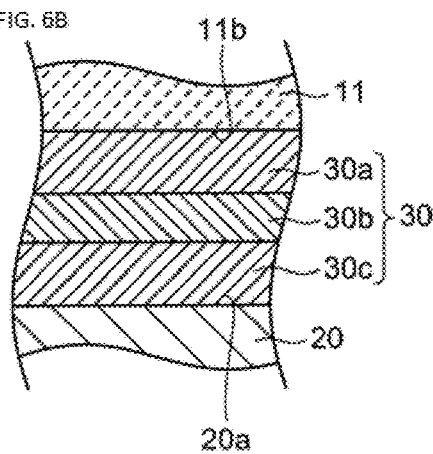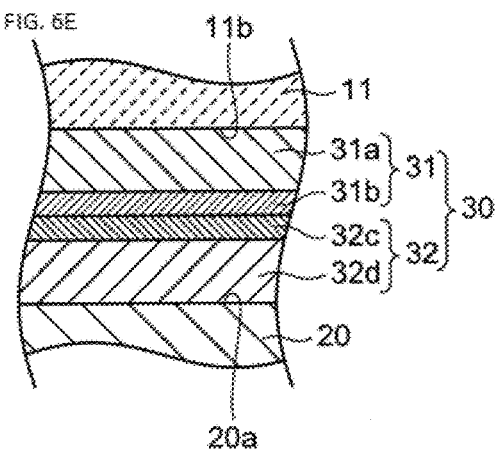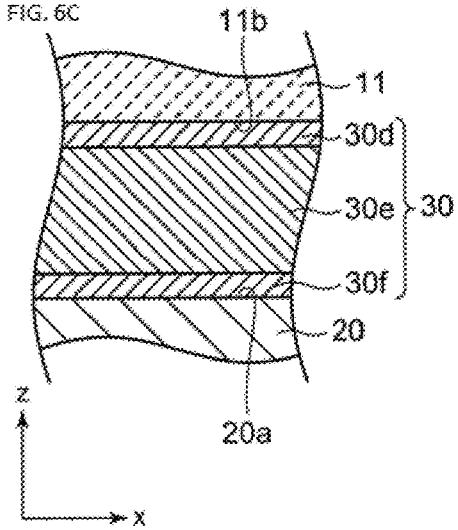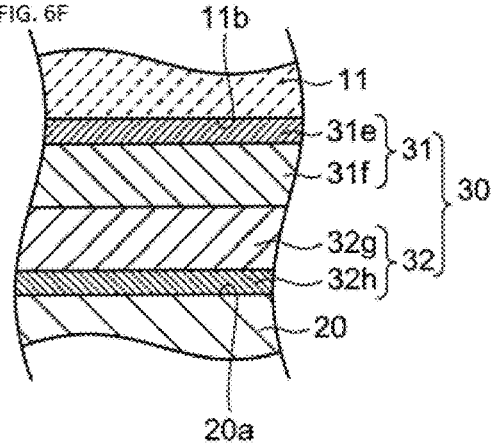

SEMICONDUCTOR DEVICE WITH METAL-BONDED HEAT DISSIPATOR AND MANUFACTURING METHOD FOR THE SAME

CROSS-REFERENCE TO RELATED APPLICATION

The present application claims priority to Japanese Patent Application No. 2014-263577, filed on Dec. 25, 2014, which is incorporated by reference in its entirety.

BACKGROUND OF THE INVENTION

1. Field of the Invention

The present disclosure relates to a semiconductor device and more particularly relates to a semiconductor device having a high efficiency of heat dissipation and a manufacturing method for the semiconductor device.

2. Description of Related Art

As for semiconductor components including high-power semiconductor elements (for example, semiconductor light-emitting elements for a vehicle), it is important to efficiently dissipate heat generated by the semiconductor elements during use. Accordingly, a heat dissipation member comprising a material having high heat conductivity is mounted on the semiconductor component to improve heat dissipation. In the semiconductor component, a ceramic substrate having good heat conductivity is employed for a substrate on which the semiconductor element is disposed (see Patent Literatures 1 to 3: Japanese Unexamined Patent Application Publication No. 2009-194275, Japanese Unexamined Patent Application Publication No. 2013-055218, and Japanese Unexamined Patent Application Publication No. 2010-166019). When the semiconductor component is mounted on the heat dissipation member, the ceramic substrate of the semiconductor component is bonded to the heat dissipation member. It is known that soldering (Patent Literatures 1 and 2) or silver paste (Patent Literature 3), for example, is employed as a bonding method in this case,. Also, as another method for joining a plurality of members, a low-temperature bonding method has been known (Patent Literature 4: Japanese Unexamined Patent Application Publication No. 2008-207221). In the low-temperature joining method, metal films are formed on a bonding surface of each member in a vacuum, and a plurality of members can be bonded by contacting the metal films with each other. It is expected that using the low-temperature joining method for bonding the semiconductor component to the heat dissipation member allows for improving a heat dissipation performance.

In the bonding methods disclosed in Patent Literatures 1 to 3, the heat conductivity of solder or silver paste may not be sufficiently high, and an efficiency in dissipating heat from the semiconductor component to the heat dissipation member may not be sufficient. In the low-temperature bonding method disclosed in Patent Literature 4, the semiconductor component and the heat dissipation member are bonded with a metal material having high heat conductivity, so that an efficiency in dissipating heat from the semiconductor component to the heat dissipation member can be high, compared with the efficiencies in Patent Literatures 1 to 3. However, further improvement in heat dissipation has been required because of an increase in the amount of generated heat according to an increase in light output of the semiconductor element.

SUMMARY OF THE INVENTION

It is an object of an embodiment of the present invention to provide a semiconductor device having a high efficiency in dissipating heat from a semiconductor component to a heat dissipation member and a method for manufacturing the device.

A semiconductor device according to one embodiment of the present invention includes a substrate on which a semiconductor element is disposed on an upper surface, a heat dissipation member, and a metal bonding layer bonding a lower surface of the substrate to an upper surface of the heat dissipation member, and an area of the upper surface of the heat dissipation member is larger than an area of the lower surface of the substrate, and the metal bonding layer contacts a whole of the lower surface of the substrate and has an area larger than the area of the lower surface of the substrate, and a heat conductivity of the metal bonding layer is higher than a heat conductivity of the heat dissipation member.

Further, a manufacturing method for a semiconductor device according to one embodiment of the present invention includes mounting a semiconductor element on an upper surface of a substrate, forming a first metal layer on a lower surface of the substrate, forming a second metal layer having an area larger than an area of the lower surface of the substrate, on an upper surface of a heat dissipation member, and contacting the first metal layer and the second metal layer to bond the first metal layer to the second metal layer, and heat conductivity of a metal bonding layer made of the first metal layer and the second metal layer is higher than heat conductivity of the heat dissipation member.

In the semiconductor device according to one embodiment of the present invention, the metal bonding layer, whose heat conductivity is higher than the heat conductivity of the heat dissipation member, is used for bonding the heat dissipation member to the substrate on which the light-emitting elements are mounted, and the area of the metal bonding layer is larger than the area of the substrate. This configuration allows the metal bonding layer to spread the heat generated in the light-emitting elements and transfer the heat to the heat dissipation member, so that the efficiency of heat dissipation can be enhanced.

BRIEF DESCRIPTION OF THE DRAWINGS

FIGS. 6A to 6F are schematic partial enlarged cross-sectional views illustrating various configurations of a metal bonding layer included in a semiconductor device.

DETAILED DESCRIPTION OF PREFERRED EMBODIMENTS

Hereinafter, embodiments of the present invention will be described in detail based on drawings. It is noted that, in the following description, words indicating specific directions or positions (for example, "up", "down", "right", "left", and other terms inclusive of these words) are used as needed. The use of these words is aimed at facilitating the understanding of the embodiments of the present invention with reference to the drawings, but the technical scope of the present invention is not limited by the meanings of these words. Also, a portion denoted by the same reference number illustrated in a plurality of drawings represents the same portion or member.

First Embodiment

Figure 1:
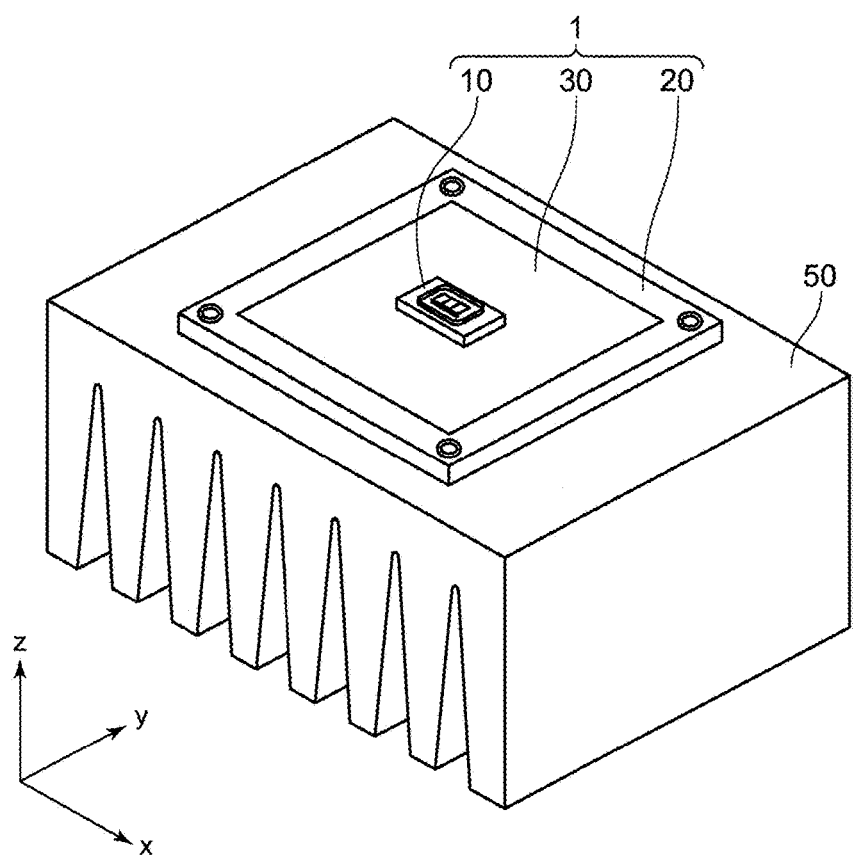
FIG. 1 is a schematic perspective view illustrating a state where a semiconductor device according to a first embodiment of the present invention is mounted on an external heat dissipation member.
Figure 2:
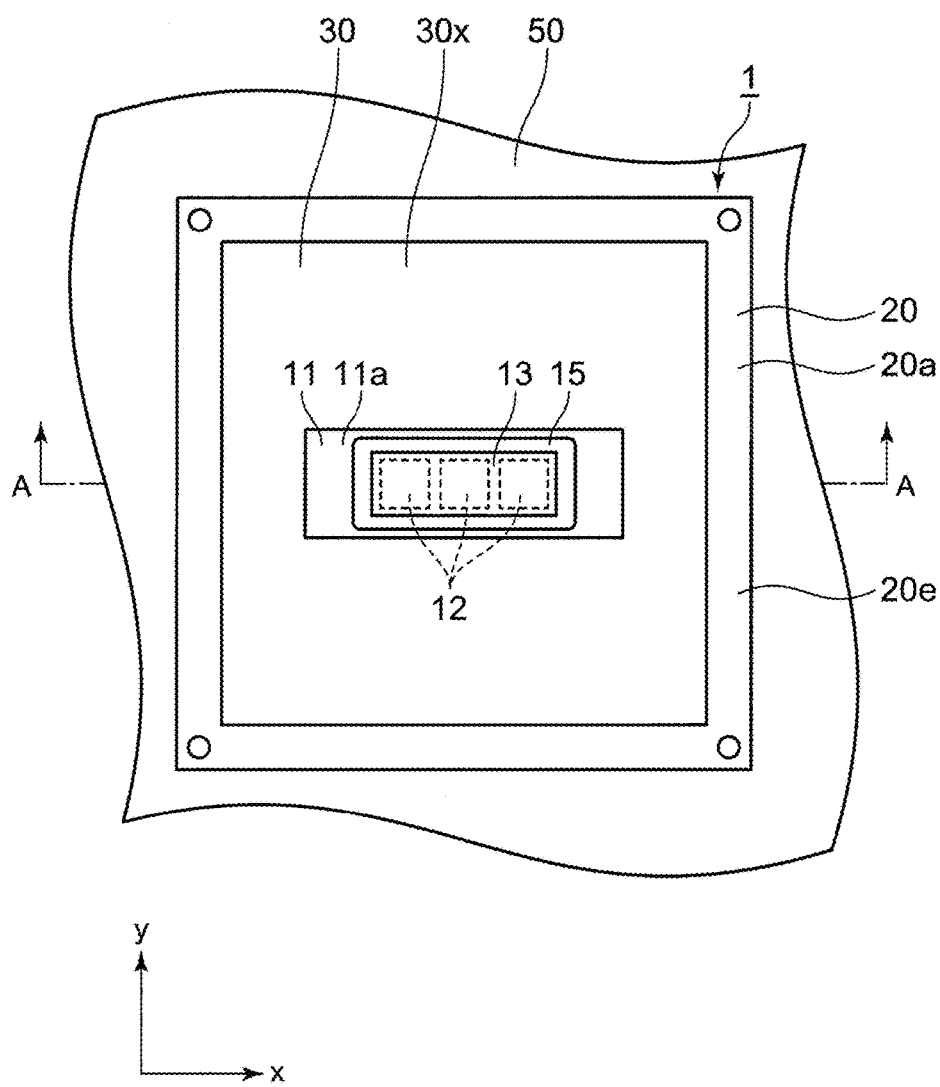
FIG. 2 is a schematic partial enlarged top view of the semiconductor device and the external heat dissipation member illustrated in FIG. 1.
Figure 3:
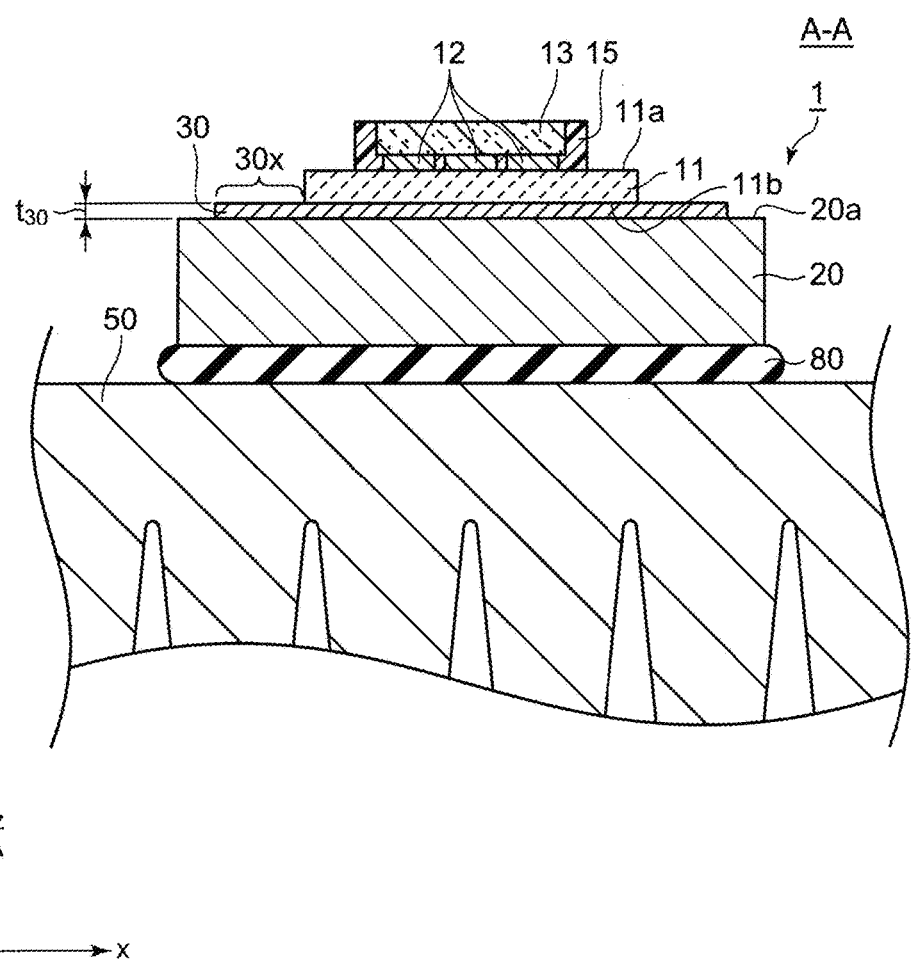
FIG. 3 is a schematic cross-sectional view of the semiconductor device taken along the line A-A of FIG. 2.

In the present embodiment, a semiconductor device in which a semiconductor element is a light-emitting element (that is, a semiconductor light-emitting device) is explained as an example. FIGS. 1 to 3 illustrate the semiconductor device (the semiconductor light-emitting device) 1 according to the present embodiment and an external heat dissipation member (heat sink) 50, on which the semiconductor device 1 is placed. The semiconductor light-emitting device 1 includes a semiconductor component (a light-emitting component) 10, a heat dissipation member (heat spreader) 20, and a metal bonding layer 30.

As illustrated in FIGS. 2 to 3, the light-emitting component 10 includes a substrate 11 and a semiconductor element (a light-emitting element) 12 disposed on the upper surface 11a of the substrate 11. The substrate 11 can be one in which metal patterns connected to the light-emitting elements 12 are provided on a main body made of an insulation material having good heat dissipation. In the present embodiment, a ceramic substrate in which a ceramic material is used for the main body is employed.

The heat spreader 20 is a plate-like member to dissipate heat generated in the light-emitting element 12, and the heat spreader 20 can improve the efficiency of heat dissipation independently or in combination with the heat sink. The area of the upper surface 20a of the heat spreader 20 is set larger than the entire area of the lower surface 11b of the substrate 11 (see FIGS. 1 and 2). In the present embodiment, the heat spreader 20 is exemplified as the heat dissipation member on which the light-emitting component 10 is mounted, but the heat sink 50 may be used as the heat dissipation member. In that case, the light-emitting component 10 can be directly mounted on the heat sink 50 without using the heat spreader 20.

The metal bonding layer 30 that covers at least a portion of the upper surface 20a is provided on the upper surface 20a of the heat spreader 20. The light-emitting component 10 is bonded to the heat spreader 20 via the metal bonding layer 30. More specifically, the metal bonding layer 30 bonds the lower surface 11b of the substrate 11 of the light-emitting component 10 to the upper surface 20a of the heat spreader 20. The area of the metal bonding layer 30 is larger than the area of the lower surface 11b of the substrate 11 of the light-emitting component 10. Then, an arrangement of the light-emitting component 10 on the metal bonding layer 30 is such that the whole of the lower surface 11b of the substrate 11 is disposed within a region where the metal bonding layer 30 is formed. This allows the whole of the lower surface 11b of the substrate 11 to contact the metal bonding layer 30. A heat conductivity of the metal bonding layer 30 is higher than a heat conductivity of the heat spreader 20. The metal bonding layer 30 includes the aforementioned features, so that the efficiency of the heat dissipation of the semiconductor light-emitting device 1 can be improved.

Figure 4:
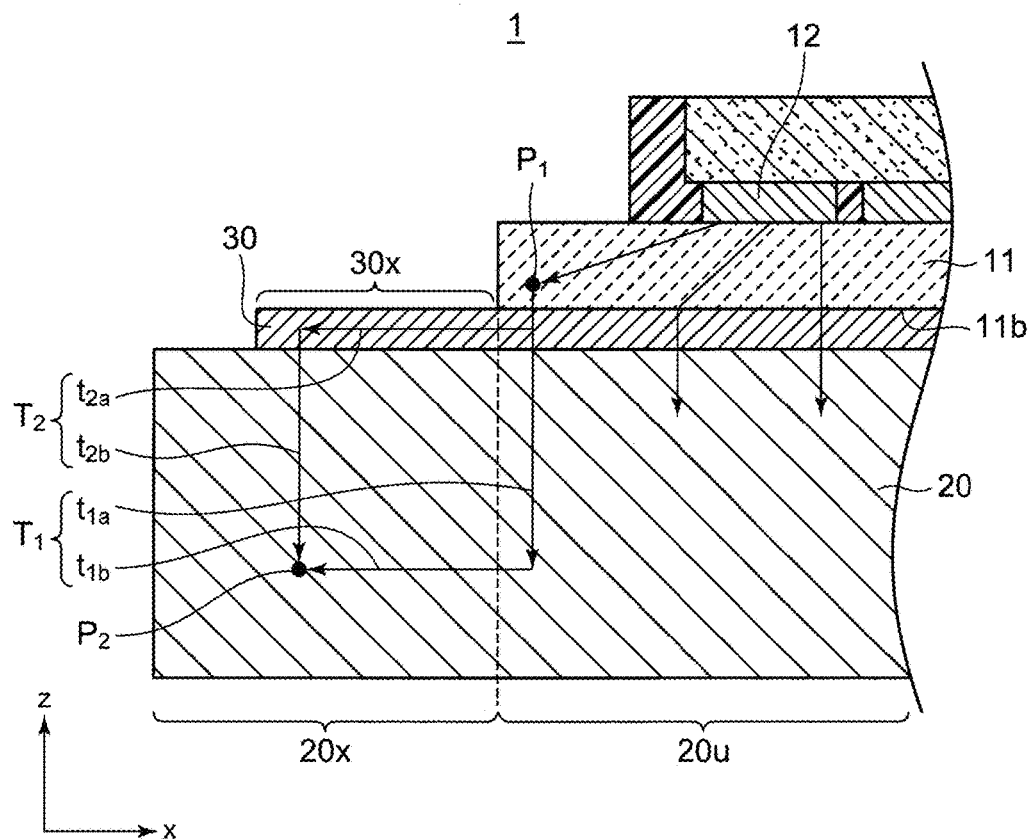
FIG. 4 is a schematic partial enlarged cross-sectional view to describe the heat dissipation path of the semiconductor device according to the first embodiment.

Although the reason for improvement in the efficiency of the heat dissipation in the present embodiment has not been clearly established, it is thought to be due to the mechanism described below. As illustrated in FIG. 4, the heat generated in the light-emitting elements 12 is spread in the substrate 11 and transmitted to the metal bonding layer 30, and further transferred to the heat spreader 20. The heat tends to be concentrated in an area 20u of the heat spreader 20 immediately below the substrate 11. Facilitating heat conduction in an area (peripheral region 20x) on the outer side with respect to the area 20u immediately below the substrate 11 is effective to enhance the efficiency of the heat dissipation.

In the semiconductor light-emitting device 1 according to the present embodiment, the area of the metal bonding layer 30 is larger than the entire area of the lower surface 11b of the substrate 11. Accordingly, arranging the light-emitting component 10 on the metal bonding layer 30 allows at least a portion of a periphery of the metal bonding layer 30 to extend outside of the substrate 11 (the portion extending outside is referred to as "outer extending portion 30x"). A heat dissipation path from the substrate 11 to the peripheral region 20x of the heat spreader 20 (e.g., from a point P1 to a point P2) includes a first heat dissipation path $T_1$ that does not pass through the outer extending portion 30x of the metal bonding layer 30 and a second heat dissipation path $T_2$ that passes through the outer extending portion 30x. The first heat dissipation path $T_1$ starts at the point $P_1$, penetrates through the metal bonding layer 30 in the thickness direction (−z direction) of the metal bonding layer 30, and advances to the region 20u immediately below the heat spreader 20 (path $t_{1a}$). Subsequently, the first heat dissipation path $T_1$ advances in the lateral direction (−x direction) in the heat spreader 20 and reaches the point $P_2$ (path $t_{1b}$). In contrast, the second heat dissipation path $T_2$ advances from the point $P_1$ to the metal bonding layer 30, and then advances in the metal bonding layer 30 in the direction (−x direction in FIG. 4) orthogonal to the thickness direction of the metal bonding layer 30 and reaches the outer extending portion 30x (path $t_{2a}$). Subsequently, the second heat dissipation path $T_2$ advances in the thickness direction (−z direction) of the metal bonding layer 30 and reaches the point $P_2$ (path $t_{2b}$).

Comparing the heat dissipation paths, there is no difference in easiness of heat conduction (heat transmissivity) between $t_{1a}$ and $t_{2b}$ because both the path $t_{1a}$ of the first heat dissipation path $T_1$ and the path $t_{2b}$ of the second heat dissipation path $T_2$ advance by approximately the same distance vertically downward (−z direction) in the heat spreader 20. In contrast, the path $t_{1b}$ of the first heat dissipation path $T_1$ and the path $t_{2a}$ of the second heat dissipation path $T_2$ advance by approximately the same distance in the lateral direction (−x direction), but the path $t_{2a}$, passes through the metal bonding layer 30, and the path $t_{1b}$ passes through the heat spreader 20, so that heat conductivity of these two paths are different. As described above, the heat conductivity of the metal bonding layer 30 is higher than the heat conductivity of the heat spreader 20, so that the path $t_{2a}$, passing through the metal bonding layer 30 excels in heat conductivity, compared with the path $t_{1b}$ passing through the heat spreader 20. That is, the heat dissipation efficiency of the second heat dissipation path $T_2$ is higher than that of the first heat dissipation path $T_1$. In the semiconductor light-emitting device 1 according to the present embodiment, the metal bonding layer 30 includes the outer extending portion 30x, and the heat conductivity of the metal bonding layer 30 is higher than the heat conductivity of the heat spreader 20, so that the second heat dissipation path $T_2$ having a high heat dissipation efficiency can be formed between the substrate 11 and the peripheral region 20x of the heat spreader 20. Accordingly, the heat conduction to the peripheral region 20x is facilitated, and the heat dissipation efficiency of the semiconductor light-emitting device 1 can be improved.

In the semiconductor light-emitting device 1 illustrated in FIGS. 1 to 4, the metal bonding layer 30 is formed in a region of the upper surface 20a of the heat spreader 20, except for an fringe portion 20e (that is, the fringe portion 20e of the upper surface 20a is not covered by the metal bonding layer 30). More preferably, as represented in a semiconductor light-emitting device 2 illustrated in FIG. 5, the whole of the upper surface 20a of the heat spreader 20 is covered with the metal bonding layer 30. This further increases an area of the outer extending portion 30x of the metal bonding layer 30, so that the heat dissipation efficiency of semiconductor light-emitting device 2 can be further improved.

It is preferable that the thickness of the metal bonding layer 30 be in a range of 1 nm to 10 μm. The thickness of the metal bonding layer 30 being within this range allows for enhancing the heat dissipation efficiency of the heat dissipation path passing through the metal bonding layer 30, and allows for achieving sufficient bonding strength between the substrate 11 and the heat spreader 20. In view of the productivity of the semiconductor light-emitting device 1, preferably, the thickness of the metal bonding layer 30 is in a range of 20 nm to 200 nm.

The metal bonding layer 30 can be constituted of a single metal film (see FIG. 6A). Further, the metal bonding layer 30 can be constituted of a plurality of metal films being stacked (see FIGS. 6B to 6F). The metal bonding layer 30 including the plurality of metal films can be a metal bonding layer 30 (FIGS. 6B to 6C) including an odd number of metal films or a metal bonding layer 30 (FIGS. 6D to 6F) including an even number of metal films.

FIG. 6B illustrates the metal bonding layer 30 made of three metal films 30a, 30b, and 30c. In this example, the two layers of the metal films 30a and 30c having a large thickness are provided on the lower surface 11b side of the substrate 11 and on the upper surface 20a side of the heat spreader 20, and one metal film 30b having a small thickness is provided therebetween. In this configuration, in the case where the two metal films 30a and 30c are formed of a metal material (e.g., Ag) having high heat conductivity, and the one metal film 30b is formed of a metal material (e.g., Au) having good bondability and high heat conductivity, the metal bonding layer 30 having high heat conductivity and good bondability can be obtained.

Similarly, FIG. 6C illustrates the metal bonding layer 30 made of three metal films 30d, 30e, and 30f. In the metal bonding layer 30 shown in FIG. 6C, the two metal films 30d and 30f having small thicknesses are disposed on the side of the lower surface 11b of the substrate 11 and on the side of the upper surface 20a of the heat spreader 20, and the one metal film 30e having a large thickness is disposed therebetween. In this configuration, in the case where the two metal films 30d and 30f are formed of a metal material (e.g., Cr) having good bondability with respect to the substrate 11 and the heat spreader 20, and the one metal film 30e is formed of a metal material (e.g., Ag) having high heat conductivity, the metal bonding layer 30 having high heat conductivity and good bondability can be obtained.

FIG. 6D illustrates the metal bonding layer 30 made of two metal films. In the metal bonding layer 30 shown in FIG. 6D, the metal film on the lower surface 11b side of the substrate 11 is referred to as a first metal layer 31, and the metal film on the upper surface 20a side of the heat spreader 20 is referred to as a second metal layer 32. In this configuration, in the case where both the first metal layer 31 and the second metal layer 32 are formed of a metal material (e.g., Au) having relatively good heat conductivity and bondability, the metal bonding layer 30 having relatively good heat conductivity and bondability can be obtained.

FIG. 6E illustrates the metal bonding layer 30 made of four metal films 31a, 31b, 32c and 32d. In this example, two metal films (a first metal film 31a and a fourth metal film 32d) having a large thickness are disposed on the lower surface 11b side of the substrate 11 and on the upper surface 20a side of the heat spreader 20, and two metal films (a second metal film 31b and a third metal film 32c) having a small thickness are disposed between the first metal film 31a and the fourth metal film 32d. In this configuration, in the case where the first metal film 31a and the fourth metal film 32d are formed of a metal material (e.g., Ag) having high heat conductivity, and the second metal film 31b and the third metal film 32c, which are disposed between the first metal film 31a and the fourth metal film 32d, are formed of a metal material (e.g., Au) having good bondability and high resistance to oxidation, the metal bonding layer 30 having high heat conductivity and good bondability can be obtained. The metal bonding layer 30 illustrated in FIG. 6E is formed such that the first metal layer 31 disposed on the lower surface 11b side of the substrate 11 is formed as two metal films (the first metal film 31a and the second metal film 31b), and the second metal layer 32 disposed on the upper surface 20a side of the heat spreader 20 is formed as the two metal films (the third metal film 32c and the fourth metal film 32d), and subsequently, the second metal film 31b and the third metal film 32c are bonded.

Similarly, FIG. 6F illustrates the metal bonding layer 30 made of four metal films 31e, 31f, 32g and 32h. In this example, two metal films 31e and 32h having small thicknesses are disposed on the lower surface side 11b of the substrate 11 and on the upper surface 20a side of the heat spreader 20, and two metal films 31f and 32g having a large thickness are disposed between the metal films 31e and 32h. In this configuration, in the case where the two metal films 31e and 32h are formed of a metal material (e.g., Cr) having good bondability with the substrate 11 and the heat spreader 20, and the two metal films 31f and 32g, which are disposed between the metal films 31e and 32h, are formed of a metal material (e.g., Ag) having high heat conductivity, the metal bonding layer 30 having high heat conductivity and good bondability can be obtained. The metal bonding layer 30 illustrated in FIG. 6F is formed such that a first metal layer 31 disposed on the lower surface 11b side of the substrate 11 is formed of the two metal films 31e and 31f, and a second metal layer 32 disposed on the upper surface 20a side of the heat spreader 20 is formed of the two metal films 32g and 32h, and subsequently, the metal films 31f and 32g are joined.

A difference between the configuration of the metal bonding layer 30 illustrated in FIGS. 6A to 6C and the configuration of the metal bonding layer 30 illustrated in FIGS. 6D to 6F is mainly attributed to a difference in manufacturing methods. Although its details are described later, the metal bonding layer 30 illustrated in FIGS. 6A to 6C can be formed by contacting and bonding the metal film formed on the lower surface 11b of the substrate 11 and the metal film formed on the side of the upper surface 20a of the heat spreader 20 in a vacuum. In contrast, the metal bonding layer 30 illustrated in FIGS. 6D to 6F can be formed by contacting and bonding the first metal layer 31 formed on the lower surface 11b of the substrate 11 and the second metal layer 32 formed on the upper surface 20a side of the heat spreader 20 in the air (that is, in an atmosphere that contains oxygen).

In the case where the metal bonding layer 30 is formed of a single metal film as illustrated in FIG. 6A, "the heat conductivity of the metal bonding layer 30" refers to the heat conductivity of the metal material that forms the single metal film. In the case where the metal bonding layer 30 is formed as a multilayered structure made of a plurality of metal films, the heat conductivity of the metal bonding layer 30 refers to the heat conductivity of the whole of the metal bonding layer 30. Accordingly, even in the case where one of the plurality of metal films is formed of a metal material having a low heat conductivity, forming the other metal films respectively with a metal material having high heat conductivity allows for enhancing the overall heat conductivity of the metal bonding layer 30.

In the present embodiment, the expression "the heat conductivity of the metal bonding layer 30 is higher than the heat conductivity of the heat spreader 20" means that, in the case where the metal bonding layer 30 is formed of a plurality of metal films, the heat conductivity of the metal bonding layer 30 as a whole is higher than the heat conductivity of the heat spreader 20. That is, this expression does not mean that all the metal materials included in the metal bonding layer 30 have heat conductivity higher than the heat conductivity of the heat spreader 20. Accordingly, even in the case where a metal film of a plurality of metal films of the metal bonding layer 30 formed of a metal material having heat conductivity lower than the heat conductivity of the heat spreader 20, using a metal material having heat conductivity higher than the heat conductivity of the heat spreader 20 for the other metal films allows the heat conductivity of the metal bonding layer 30 as a whole to be higher than the heat conductivity of the heat spreader 20, so that such configuration of the metal bonding layer 30 can satisfy the expression "the heat conductivity of the metal bonding layer 30 is higher than the heat conductivity of the heat spreader 20", and thus the metal bonding layer 30 with such configuration can be used in the present embodiment.

An overall heat conductivity of the metal bonding layer 30 made of the plurality of metal films can be calculated from a measured value of thermal resistance of the metal bonding layer 30. For example, regarding the semiconductor device 1 illustrated in FIG. 3, (1) measuring a thermal resistance R1 from the upper surface 11a of the substrate 11 to the upper surface 20a of the heat spreader 20, and (2) using a thermal resistance R2 (prescribed value) of the substrate 11 allows for obtaining a thermal resistance Rm (=R1−R2) of the metal bonding layer 30. In the present specification, a heat conductivity ($W \cdot m^{-1} \cdot K^{-1}$) of the whole of the metal bonding layer 30 can be obtained by dividing a thickness $t_{30}$ (m) of the metal bonding layer 30 by a thermal resistance Rm (k/W) of the metal bonding layer 30 and a total area A ($m^2$) of the metal bonding layer 30 (formula: $t_{30}/(Rm \times A)$).

In the present specification, a formula to obtain a heat conductivity T of a metal multilayered film made of the plurality of metal films is defined as follows: the heat conductivity T of the metal multilayered film in which a metal film made of metal α with heat conductivity $T_\alpha$ and a metal film made of metal β with heat conductivity $T_\beta$ are stacked based on a thickness ratio (a : b) can be obtained in the following formula (1).

$$T = T_\alpha \times T_\beta \times (a+b)/(a \times T_\beta + b \times T_\alpha) \qquad (1)$$

The aforementioned formula (1) is obtained in the following procedure.

The formula of the heat conductivity T of the metal multilayered film in which the metal film made of the metal α having heat conductivity $T_\alpha$ and the metal layer made of the metal β having heat conductivity $T_\beta$ is explained as below. The thermal resistance Rm of the entire metal multilayer film is represented as $Rm = R_\alpha + R_\beta$ by use of the thermal resistance $R_\alpha$ of the metal α and the thermal resistance $R_\beta$ of the metal β. The thermal resistance Rm is represented as $Rm = t_\alpha/(T_\alpha \times A) + t_\beta/(T_\beta \times A)$ . . . (1-1) ($t_\alpha$: thickness of metal α, $t_\beta$: thickness of metal β, and A: area of metal multilayer film). Further, the heat conductivity T of the entire metal multilayer film is represented as $T = t_{30}/(Rm \times A)$ . . . (1-2). Accordingly, when the formula (1-1) is substituted into the formula (1-2), the heat conductivity T is represented as $T = t_{30}/(t_\alpha/T_\alpha + t_\beta/T_\beta)$, which can be expanded as follows: $T = T_\alpha \times T_\beta \times t_{30}/(t_\alpha \times T_\beta + t_\beta \times T_\alpha)$. In this formula, when a thickness a is substituted into $t_\alpha$, a thickness b is substituted into $t_\beta$, and a thickness (a+b) is substituted into $t_{30}$, the heat conductivity T is represented as $T = T_\alpha \times T_\beta \times (a+b)/(a \times T_\beta + b \times T_\alpha)$ . . . (1).

As described later, in the case where the metal bonding layer 30 has a difference in level (see FIGS. 10A and 10B), a thickness $t_{32}$ of the outer extending portion 30x is represented as "a thickness $t_{30}$ of the metal bonding layer 30", and the area of the metal bonding layer 30 including the outer extending portion 30x is represented as "total area A". The heat conductivity calculated by the aforementioned formula (1) corresponds to the heat conductivity of the second metal layer 32 in FIGS. 11B and 11C.

A specific value is substituted into the expression (1) to obtain the heat conductivity of the metal bonding layer 30. The heat conductivity of the metal bonding layer 30 in which three layers are stacked as illustrated in FIG. 6B is obtained. For example, the two layers (the metal films 30a and 30c) are formed of Ag (heat conductivity: 427 $W \cdot m^{-1} \cdot K^{-1}$), and one layer (the metal film 30b) disposed between the two layers is formed of Au (heat conductivity: 315 $W \cdot m^{-1} \cdot K^{-1}$), and a ratio of the sum of the thicknesses of the metal films 30a and 30c to the thickness of the metal film 30b is represented as 5:1 (that is, the thickness of Ag is five times that of Au). An approximate value of the heat conductivity T of the metal bonding layer 30 is represented as $T = 315 \times 427 \times 6/(1 \times 427 + 5 \times 315) = 403.1$ $W \cdot m^{-1} \cdot K^{-1}$. That is, the heat conductivity T of the metal bonding layer 30 is higher than that of Cu (398 $W \cdot m^{-1} \cdot K^{-1}$). For this reason, the metal bonding layer 30 made of Ag and Au can be used in combination with the heat dissipation member made of Cu.

Upon the reference to FIGS. 1 and 2 again, when the semiconductor light-emitting device 1 is fixed on the heat sink 50, for example, threaded holes may be provided in the heat spreader 20 of the semiconductor light-emitting device 1 and the heat sink 50 to allow the semiconductor light-emitting device 1 to be fixed with screws. In this case, it is preferable that heat dissipation grease 80 be interposed, in order to enhance the heat conductivity between the heat spreader 20 and the heat sink 50. Moreover, soldering can be used for fixing the semiconductor light-emitting device 1 on the heat sink 50.

Preferably, a metal material having a melting point of 350 degrees Celsius or higher is used as the metal material of the metal bonding layer 30. With this, in the case where the semiconductor light-emitting device 1 is soldered to the heat sink 50, the melting of the metal bonding layer 30 can be avoided during solder reflow (the heating of the solder at 280 to 340 degrees Celsius), so that the occurrence of the bonding failure between the light-emitting component 10 and the heat spreader 20 can be suppressed.

Upon the reference to FIG. 3 again, regarding the semiconductor light-emitting device 1 according to the present embodiment, the light-emitting component 10 may include a wavelength conversion member 13 and a light reflectivity molding body 15, in addition to the light-emitting elements 12 and the substrate 11. The wavelength conversion member 13 is a member that converts the wavelength of light from the light-emitting elements 12, and for example, a plate-like member that contains a phosphor to convert blue luminescence into yellow light can be employed. The light reflective molding body 15 is formed of a light-refleclve member (for example, a white resin material that includes a light reflective substance such as titanium oxide particles) that reflects light. A lateral surface of the light-emitting elements 12 and a lateral surface of the wavelength conversion member 13 are covered with the light reflective molding body 15, which reflects the light advancing in the lateral direction (x direction), so that the leakage of the light in the lateral direction can be reduced.

Figure 7:
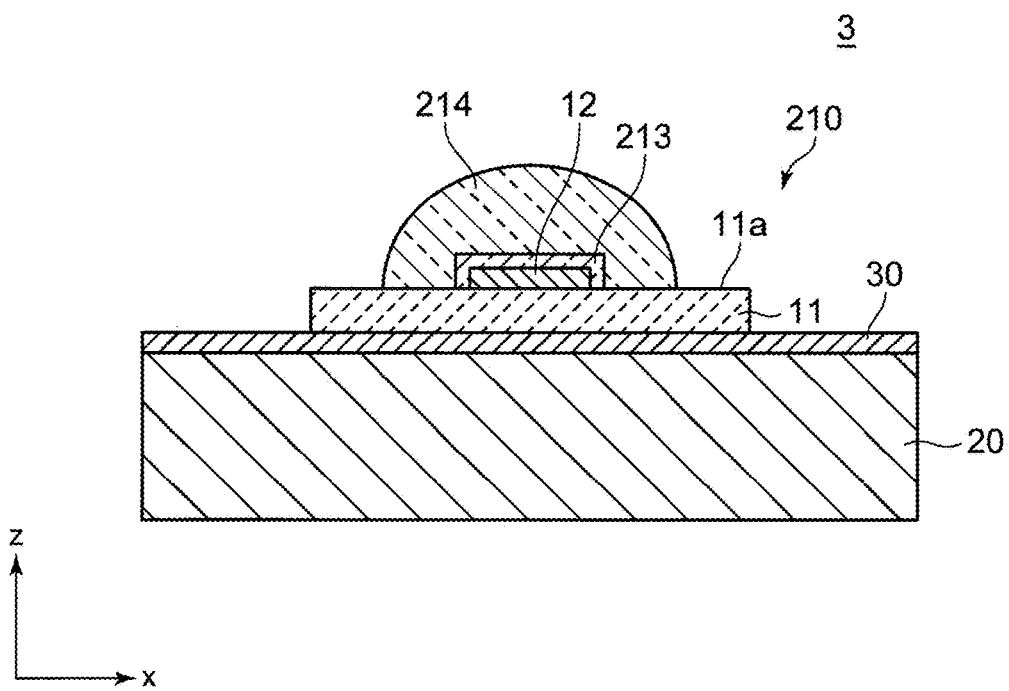
FIG. 7 is a schematic cross-sectional view illustrating another modification of a semiconductor device according to one embodiment of the present invention.

As a semiconductor light-emitting device 3 illustrated in FIG. 7, a light-emitting component 210 with another configuration can be employed. The light-emitting component 210 includes the light-emitting elements 12 disposed on the upper surface 11a of the substrate 11, a wavelength conversion layer 213 covering the upper surface and the lateral surface of the light-emitting elements 12, and a resin molding body 214 covering the light-emitting elements 12 and the wavelength conversion layer 213. The wavelength conversion layer 213 can comprise, for example, a member that contains a phosphor to convert blue luminescence into yellow light. The surface of the resin molding body 214 is formed in a hemispherical shape such as a convex lens and can control the orientation of the light from the light-emitting elements 12. The resin molding body 214 is formed of a light-transmissive resin material.

Next, the manufacturing method for the semiconductor light-emitting device 1 according to the present embodiment will be described referring to FIGS. 8A to 8C, FIGS. 9A and 9B, and FIGS. 10A and 10B.

Preparation of Light-Emitting Component 10

Figure 8A:
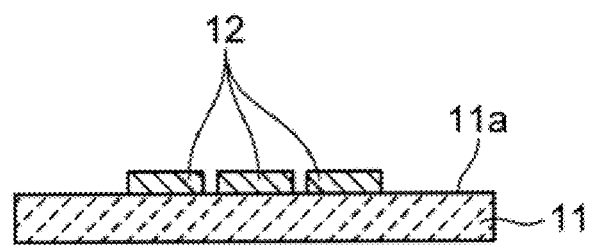
FIGS. 8A to 8C are schematic cross-sectional views to describe manufacturing steps of a semiconductor device according to one embodiment of the present invention.
Figure 8B:
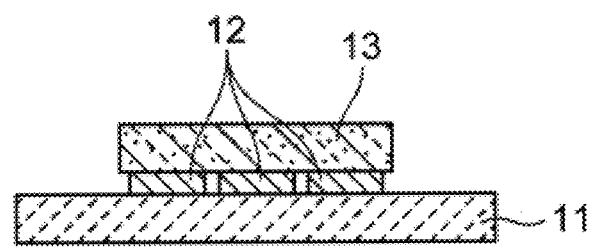
Figure 8C:
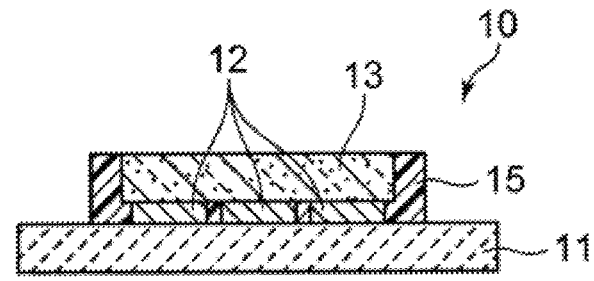

The light-emitting elements 12 are arranged on the upper surface 11a of the substrate 11 on which wiring patterns are provided (see FIG. 8A). It is noted that one or a plurality of light-emitting elements 12 (three in FIG. 8A) can be placed. In the case where the light-emitting component 10 includes the wavelength conversion member 13 and the light reflective molding body 15, the wavelength conversion member 13 and the light reflective molding body 15 are sequentially formed. First, the wavelength conversion member 13 is fixed on the light-emitting elements 12 with a transparent adhesive material (see FIG. 8B). Subsequently, the lateral surface of the light-emitting elements 12 and the lateral surface of the wavelength conversion member 13 are covered with the light reflective molding body 15 (see FIG. 8C).

Formation of First Metal Layer 31

Figure 9A:
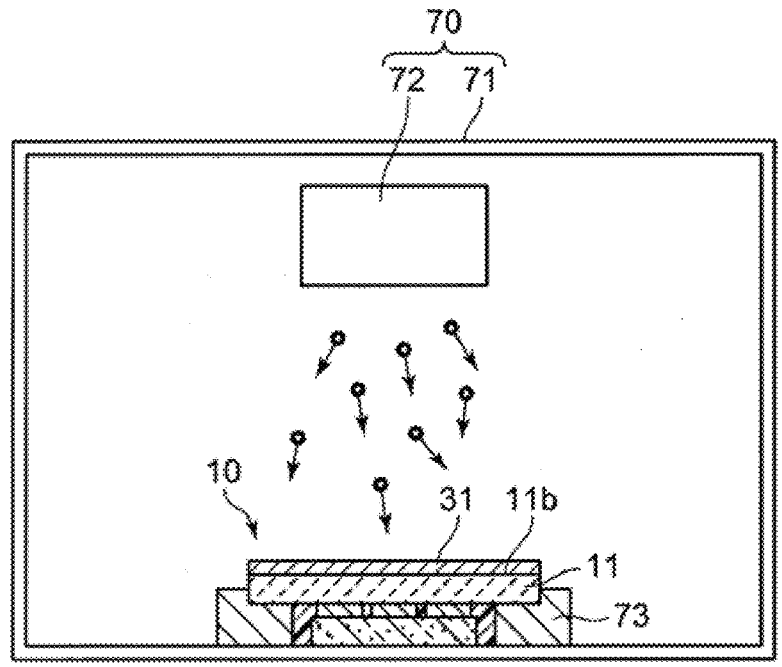
FIGS. 9A and 9B are schematic cross-sectional views to describe manufacturing steps of a semiconductor device according to one embodiment of the present invention.

The first metal layer 31 is formed on the lower surface 11b of the substrate 11 of the light-emitting component 10 using a sputtering method (see FIG. 9A). First, the light-emitting component 10 is arranged in a vacuum chamber 71 of a sputtering device 70. In this time, a position and a direction of the light-emitting component 10 are adjusted in such a manner that the lower surface 11b of the substrate 11 faces a sputtering target 72. In FIG. 9A, the sputtering target 72 is arranged on an upper side of the vacuum chamber 71, so that the light-emitting component 10 is arranged in such a manner that the lower surface 11b of the substrate 11 below the sputtering target 72 faces upward. In this step, a holding member 73 to hold the light-emitting component 10 at a predetermined position and in a predetermined direction may be employed.

Formation of Second Metal Layer 32

Figure 9B:
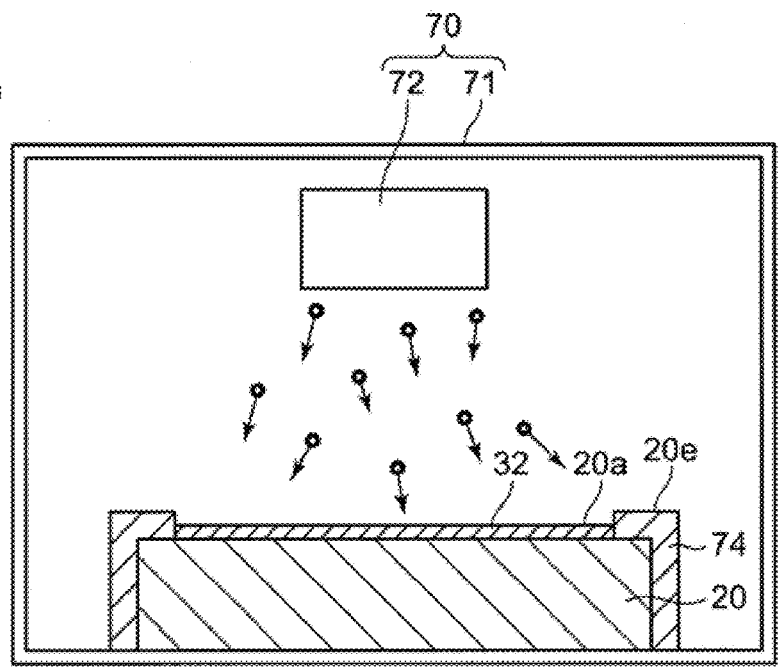

The second metal layer 32 is formed on the upper surface 20a of the heat spreader 20 using a sputtering method (see FIG. 9B). In this time, the second metal layer 32 is formed in such a manner that the area of the second metal layer 32 becomes larger than at least the area of the lower surface 11b of the substrate 11. First, the heat spreader 20 is arranged in the vacuum chamber 71 of the sputtering device 70. In this time, the position and direction of the heat spreader 20 are adjusted in such a manner that the upper surface 20a of the heat spreader 20 faces the sputtering target 72. In FIG. 9B, similarly to the film formation on the light-emitting component 10, the heat spreader 20 is arranged in such a manner that the upper surface 20a of the heat spreader 20 under the sputtering target 72 faces upward. At this time, a holding member 74 to hold the heat spreader 20 at a predetermined position and in a predetermined direction may be employed. In the diagram, the holding member 74 covers parts (e.g., the fringe portion 20e) of the upper surface 20a of the heat spreader 20, so that the second metal layer 32 is not formed on the fringe portion 20e of the upper surface 20a held by the holding member 74.

Fourth Step: Joining Metal Layers 31 and 32

Figure 10A:
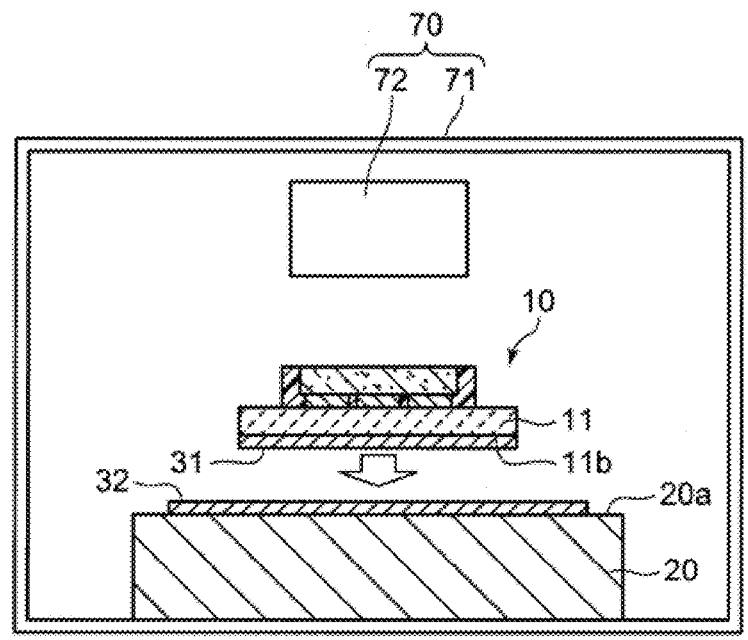
FIGS. 10A and 10B are schematic cross-sectional views to describe manufacturing steps of a semiconductor device according to one embodiment of the present invention.

The first metal layer 31 formed on the lower surface 11b of the substrate 11 of the light-emitting component 10 and the second metal layer 32 formed on the upper surface 20a of the heat spreader 20 are brought into contact with each other in the vacuum chamber 71 of the sputtering device 70 at a low temperature (see FIG. 10A). The first metal layer 31 and the second metal layer 32, which are kept to be in the vacuum since being formed in the vacuum chamber 71, has a high surface energy. Accordingly, bringing the first metal layer 31 with the second metal layer 32 into contact in a low temperature causes atomic diffusion, so that they can be bonded with each other. This bonding approximately allows a boundary line between the first metal layer 31 and the second metal layer 32 to vanish approximately, and for example, the metal bonding layer 30 made of the one metal film as illustrated in FIG. 6A is formed. Upon bringing the first metal layer 31 and the second metal layer 32 into contact with each other, the positions of the light-emitting component 10 and the heat spreader 20 are adjusted such that the lower surface 11b of the substrate 11 of the light-emitting component 10 is arranged at a desired position on the second metal layer 32 formed on the upper surface 20a of the heat spreader 20.

In the case where the first metal layer 31 and the second metal layer 32 are formed of a metal material (for example, Au or Au alloy) that has good resistance to oxidation and has a large diffusion coefficient, these metal layers 31 and 32 can be bonded in the air (in the atmosphere that contains oxygen). More specifically, the first metal layer 31 and the second metal layer 32 are formed in the vacuum chamber 71, and subsequently, the light-emitting component 10 and the heat spreader 20 are taken out from the vacuum chamber 71 to the air. Then, the first metal layer 31 formed on the lower surface 11b of the substrate 11 of the light-emitting component 10 and the second metal layer 32 formed on the upper surface 20a of the heat spreader 20 are brought into contact with each other in the air at a low temperature. This allows the first metal layer 31 and the second metal layer 32 to bond each other. However, since the first metal layer 31 and the second metal layer 32 are taken out to the air, the surface energy of the first metal layer 31 and the second metal layer 32 is reduced, which does not cause the boundary line between the first metal layer 31 and the second metal layer 32 to vanish. Accordingly, as illustrated in FIG. 6D, the metal bonding layer 30 is formed in a state where the first metal layer 31 and the second metal layer 32 are distinguishable.

The effects of bonding the metal layers in the vacuum or the air is summarized as below: in the case where the metal layers 31 and 32 are bonded in the vacuum, a bonding force between the metal layers 31 and 32 can be enhanced. In contrast, in the case where the metal layers 31 and 32 are bonded in the air, it is easy to perform the adjustment of the positions of the light-emitting component 10 and the heat spreader 20 during bonding of the metal layers 31 and 32. Accordingly, the enhancement of positioning accuracy of the light-emitting component 10 with respect to the heat spreader 20 can be facilitated, and reduce in a rate of occurrence of defective products and the improvement of yields can be expected.

Figure 10B:
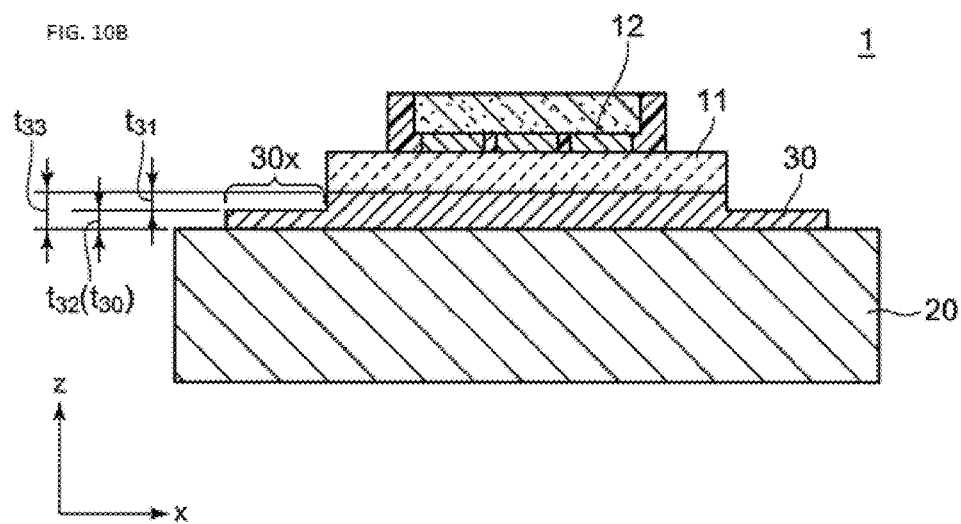

Through the steps mentioned above, the semiconductor light-emitting device 1 in which the light-emitting component 10 and the heat spreader 20 are bonded with the metal bonding layer 30 can be obtained (see FIG. 10B). It is noted that the metal bonding layer 30 formed using the aforementioned method has two different thicknesses. One is a thickness $t_{33}$ (the sum of a thickness $t_{31}$ of the first metal layer 31 and a thickness $t_{32}$ of the second metal layer 32) of a relatively thick portion in the area under the light-emitting component 10. The other is a thickness $t_{32}$ (which corresponds to a thickness $t_{32}$ of the second metal layer 32) of a relatively thin portion of the outer extending portion 30x. Thus, in the case where the metal bonding layer 30 includes the portions having different thicknesses, the thickness $t_{32}$ of the second metal layer 32 is regarded as a thickness $t_{30}$ of the metal bonding layer 30. The outer extending portion 30x of the metal bonding layer 30 is mainly contributed to heat dissipation, and therefore the thickness (that is, the thickness $t_{32}$) of the outer extending portion 30x is considered as the thickness $t_{30}$ of the metal bonding layer 30 in the following manner.

Also, the metal bonding layer 30 illustrated in FIGS. 6A to 6F described above may be formed by changing the conditions of the second step: the formation of the first metal layer 31, the third step: the formation of the second metal layer 32, and the fourth step: the joining of the metal layers 31 and 32 as below.

Metal Bonding Layer 30 in FIGS. 6A and 6D

Figure 11A:
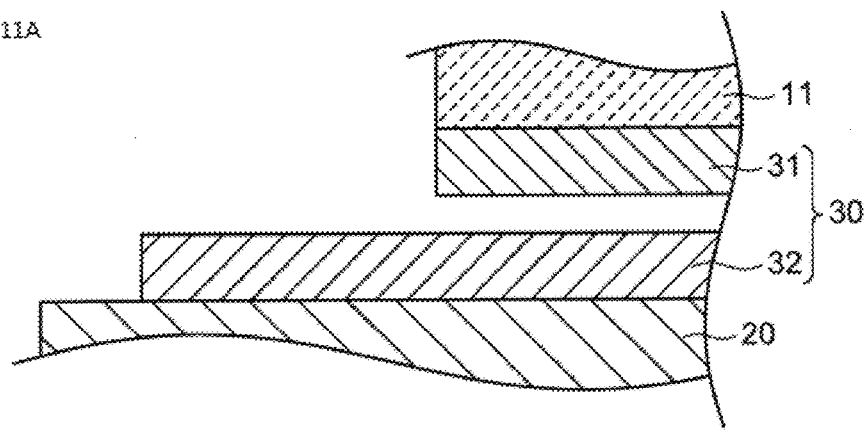
FIGS. 11A to 11C are schematic partial enlarged cross-sectional views illustrating the configuration of stacking metal films to form the metal bonding layers illustrated in FIGS. 6A to 6F.

First, the first metal layer 31 is formed on the lower surface 11b of the substrate 11 of the light-emitting component 10, and the second metal layer 32 is formed on the upper surface 20a of the heat spreader 20 (see FIG. 11A). At this time, the first metal layer 31 and the second metal layer 32 are formed of the same metal material. In the subsequent step of bonding the metal films, in the case where the first metal layer 31 and the second metal layer 32 are brought into contact with each other in a vacuum, the metal bonding layer 30 made of a single metal film can be formed as illustrated in FIG. 6A. In contrast, in the case where the first metal layer 31 and the second metal layer 32 are brought into contact with each other in the air, the metal bonding layer 30 made of the two metal layers 31 and 32 can be formed as illustrated in FIG. 6D.

Metal Bonding Layer 30 in FIGS. 6B and 6E

Figure 11B:
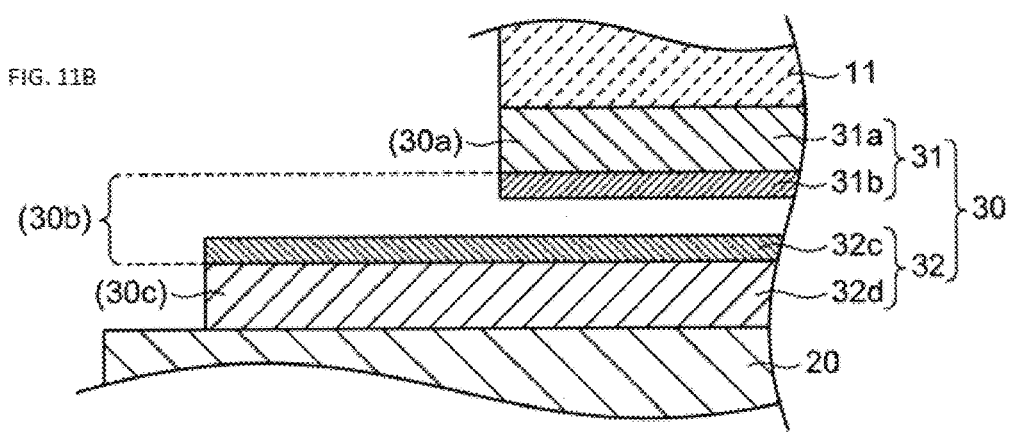

First, the first metal film 31a and the second metal film 31b are stacked in this order on the lower surface 11b of the substrate 11 of the light-emitting component 10 to form the first metal layer 31 (see FIG. 11B). The fourth metal film 32d and the third metal film 32c are stacked in this order on the upper surface 20a of the heat spreader 20 to form the second metal layer 32 (see FIG. 11B). In this time, the second metal film 31b and the third metal film 32c are formed of the same metal material. In the subsequent step of bonding the metal films, in the case where the first metal layer 31 and the second metal layer 32 are brought into contact with each other in a vacuum, the second metal film 31b and the third metal film 32c are bonded into the single metal film 30b, and as illustrated in FIG. 6B, the metal bonding layer 30 made of the three metal layers 30a, 30b, and 30c is formed. In contrast, in the case where the first metal layer 31 and the second metal layer 32 are brought into contact with each other in the air, as illustrated in FIG. 6E, the metal bonding layer 30 made of four metal layers 31a, 31b, 32c and 32d is formed.

In the case of the metal bonding layer 30 illustrated in FIG. 6E, the first metal film 31a and the fourth metal film 32d are formed of the metal material such as Ag having high heat conductivity, and the second metal film 31b and the third metal film 32c are formed of the metal material such as Au having good bondability, thereby obtaining the metal bonding layer 30 having high heat conductivity and good bondability. At the outer extending portion 30x, the third metal film 32c of the second metal layer 32 is exposed to the surface of the. Au, which forms the third metal film 32c, has low reflectivity, compared with Ag, which forms the fourth metal film 32d. Accordingly, extremely reducing the thickness of the third metal film 32c (for example, 20 nm or less) allows the influence of the reflected light from the third metal film 32c to be diminished to a great degree. Consequently, the outer extending portion 30x can serve as a light reflection member.

Metal Bonding Layer 30 in FIGS. 6C and 6F

Figure 11C:
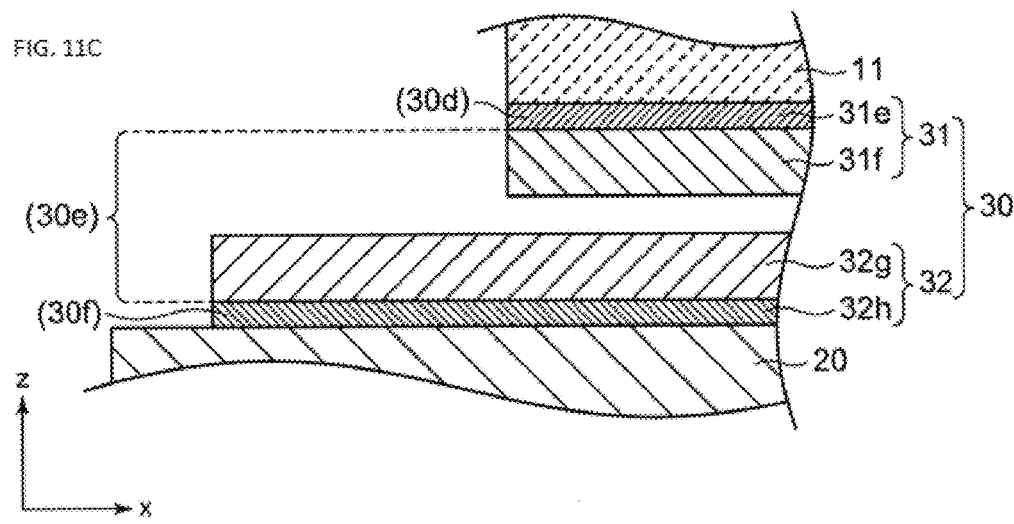

First, the first metal film 31e and the second metal film 31f are stacked in order on the lower surface 11b of the substrate 11 of the light-emitting component 10 to form the first metal layer 31 (see FIG. 11C). The fourth metal film 32h and the third metal film 32g are stacked in this order on the upper surface 20a of the heat spreader 20 to form the second metal layer 32 (see FIG. 11C). In this time, the second metal film 31f and the third metal film 32g are formed of the same metal material. In the subsequent step of bonding the metal films, in the case where the first metal layer 31 and the second metal layer 32 are brought into contact with each other in a vacuum, the second metal film 31f and the third metal film 32g are bonded into the single metal film 30e, as illustrated in FIG. 6C, the metal bonding layer 30 made of three metal films 30d, 30e, and 30f is formed. On the other hand, in the case where the first metal layer 31 and the second metal layer 32 are brought into contact with each other in the air, as illustrated in FIG. 6F, the metal bonding layer 30 made of the four metal films 31e, 31f, 32g, and 32h is formed.

Figure 12:
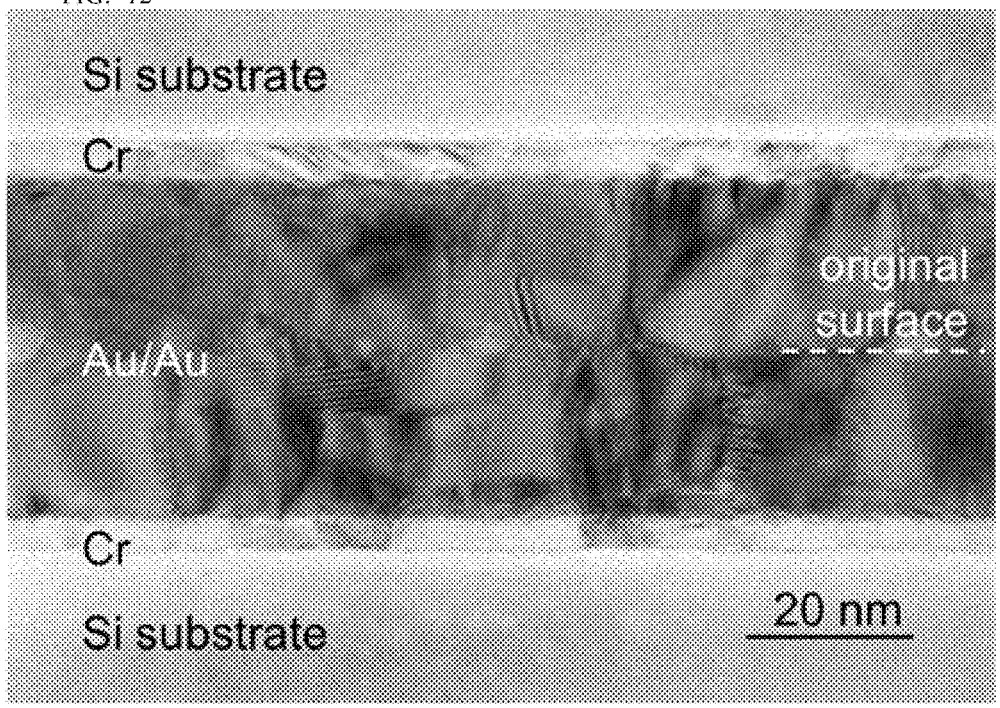
FIG. 12 is a schematic cross-sectional TEM image of the metal bonding layer of the present invention.

FIG. 12 illustrates a cross-sectional TEM image of the metal bonding layer 30 where the first metal layer 31 and the second metal layer 32 are stacked and joined with each other in the air, as illustrated in FIG. 11C (that is, the metal bonding layer 30 illustrated in FIG. 6F). The first metal film 31e in the first metal layer 31 and the fourth metal film 32h in the second metal layer 32 are films made of Cr (with thickness of 0.5 nm). The second metal film 31f in the first metal layer 31 and the third metal film 32g in the second metal layer 32 are films made of Au (with thickness of 5 nm). With this configuration, the interface between the second metal film 31f and the third metal film 32g is not vanished, so that the second metal film 31f and the third metal film 32g can be recognized as two layers.

The order of formation of the first metal layer 31 and the second metal layer 32 can be changed. For example, it may be such that the second metal layer 32 is formed on the upper surface 20a of the heat spreader 20, and subsequently the first metal layer 31 is formed on the lower surface 11b of the substrate 11 of the light-emitting component 10. Furthermore, in the case where the first metal layer 31 and the second metal layer 32 are made of the same metal material, the film formation of the first metal layer 31 and the second metal layer 32 may be performed as the same step. That is, the sputtering target 72 is sputtered in a state where the heat spreader 20 and the light-emitting component 10 are arranged in the vacuum chamber 71, so that the film formation of the first metal layer 31 and the film formation of the second metal layer 32 can be performed in the same step. Even in the case where the first metal layer 31 and the second metal layer 32 are formed of a plurality of metal films (for example, FIGS. 11B and 11C), as long as the layer constitution of the plurality of metal films and the thicknesses of respective metal films are the same, the formation of the metal films can be simultaneously performed in the same step.

Figure 5:
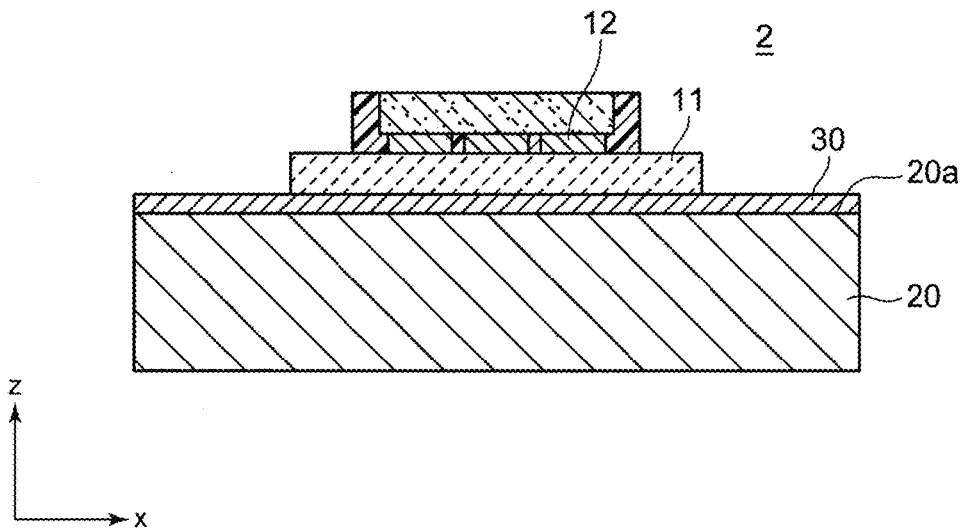
FIG. 5 is a schematic cross-sectional view illustrating a modification example of the semiconductor device according to the first embodiment.

As illustrated in FIG. 5, in the case where the metal bonding layer 30 is formed on the whole of the upper surface 20a of the heat spreader 20, a holding member 74 that does not cover the fringe portion 20e of the upper surface 20a of the heat spreader 20 (that is, the upper surface 20a of the heat spreader 20 is not covered at all) can be used, instead of the holding member 74 illustrated in FIG. 9B. Further, in the case where the heat spreader 20 can be stably arranged in the vacuum chamber 71, the second metal layer 32 may be formed on the heat spreader 20 without using the holding member 74.

The sputtering method is employed for forming the first metal layer 31 and the second metal layer 32 described above. However, the present embodiment is not limited to using the sputtering method, but known film forming methods (for example, a vacuum evaporation method, and an ion plating method) may be applied. The sputtering method, a CD method using a vacuum chamber, the vacuum evaporation method, and the ion plating method have an advantage in that the subsequent step of bonding the metal layers 31 and 32 in a vacuum can be performed.

Hereinafter, materials suitable for respective members that comprises the semiconductor device according to the first embodiment will be described.

Substrate 11

As the substrate 11, one in which metal patterns are provided in a main body having insulation properties can be employed. Materials suitable for the substrate 11 are exemplified by insulating materials such as glass epoxy, resin, and ceramics. In particular, a ceramic material that has good heat dissipation is preferable. For example, the ceramic materials suitable for the substrate 11 are exemplified by alumina, AlN, SiC, GaN, and LTCC. In particular, AlN that has good processing ability and has good heat conductivity is preferable.

Semiconductor Element 12

The light-emitting elements 12 suitable for the semiconductor device according to the present embodiment are exemplified by a light-emitting diode, a laser diode, and a power semiconductor element. The light-emitting elements 12 emit heat during use, so that advantageous effects such as the reduction in the malfunction of the semiconductor elements and long service life can be achieved by using the semiconductor device with good heat dissipation according to the present embodiment.

Heat dissipation Member 20

In an embodiment of the invention, the heat dissipation member has a higher heat conductivity than that of the substrate on which the semiconductor elements are arranged. The heat dissipation member 20 includes a heat spreader, a heat sink, and the like. The heat dissipation member 20 dissipates the heat generated in the light-emitting component 10 to the outside and therefore is formed of a material having high heat conductivity. Furthermore, in order to enhance the efficiency of heat dissipation, there is a case where a protrusion such as a fin is provided so as to increase a surface area, and a metal material having excellent castability, such as a die casting alloy, is also preferable. Specific materials to be used are exemplified by metal materials such as ADC12 (Al—Si—Cu based alloy for aluminum die casting), Al, and Cu.

Metal Bonding Layer 30

The metal bonding layer 30 is a member that has high heat conductivity as a whole, compared with the heat dissipation member such as the heat spreader 20. Accordingly, materials suitable for the metal bonding layer 30 are exemplified by metal materials whose heat conductivity is higher than that of the materials used for the heat dissipation member. Specifically, it is preferable that the metal bonding layer 30 include metal selected from a group consisting of Au, Ag, Al, Cu, W, Si, Rh, Ru, and an alloy of the aforementioned metal. More preferably, the metal bonding layer 30 includes metal made of Au or an Au alloy. In the present specification, "metal materials" includes metal, semi-metal, and an alloy. Regarding the specific example of the metal materials, in the case where ADC 12 (heat conductivity: 96.3 W/mk) is used as the heat dissipation member, a metal material, for example, Au, Ag, Al, Cu, W, Si, Rh, and Ru, whose heat conductivity is higher than that of ADC 12, is preferable. In the case where Al (heat conductivity: 237 $W·m^{-1}·K^{-1}$) is used as the heat dissipation member, a metal material, for example, Au, Ag, and Cu, whose heat conductivity is higher than that of Al, is preferable. In the case where Cu (heat conductivity: 389 $W·m^{-1}·K^{-1}$) is used as the heat dissipation member, a metal material, for example, Ag, whose heat conductivity is higher than that of Cu, is preferable.

As described above, in the case where the metal bonding layer 30 is formed of the plurality of metal films, a metal material, whose heat conductivity is lower than that of the material used for the heat dissipation member, can be employed for part of the plurality of metal films. For example, in the case where Cu is used as the heat dissipation member, the metal bonding layer 30 may be formed such that a thin film made of Au, whose heat conductivity is lower than that of Cu, is stacked on the surface of a film made of Ag, whose heat conductivity is higher than that of Cu.

Thus, several embodiments according to the present invention have been described, but the present invention is not limited to the aforementioned embodiments, and, needless to say, can differ without departing from the gist of the present invention. For example, the embodiments have been exemplified by the semiconductor light-emitting device as the example of the semiconductor device. However, it should be understood that the semiconductor device of the present invention includes various semiconductor devices such as a semiconductor memory and a power semiconductor.

What is claimed is:

1. A semiconductor device comprising:
    an insulating substrate;
    a semiconductor element disposed on an upper surface of the substrate;
    a heat dissipation member; and
    a multilayered metal bonding structure bonding a lower surface of the substrate to an upper surface of the heat dissipation member, wherein the metal bonding structure comprises:
        a first metal layer having an upper surface that directly contacts the lower surface of the substrate, and
        a second metal layer having a lower surface that directly contacts the upper surface of the heat dissipation member,
    wherein the first metal layer and the second metal layer of the metal bonding structure have a same thickness,
    wherein a thickness of the metal bonding structure is in a range of 20 nm to 200 nm,
    wherein an area of the upper surface of the heat dissipation member is larger than an area of the lower surface of the substrate, and
    wherein the metal bonding structure contacts a whole of the lower surface of the substrate and has an area larger than the area of the lower surface of the substrate, and
    wherein a heat conductivity of the metal bonding structure is higher than a heat conductivity of the heat dissipation member.

2. The semiconductor device according to claim 1, wherein a whole of the upper surface of the heat dissipation member is covered by the metal bonding structure.

3. The semiconductor device according to claim 1, wherein the metal bonding structure comprises a metal material having a melting point of 350 degrees Celsius or higher.

4. The semiconductor device according to claim 1, wherein the metal bonding structure includes at least a metal selected from a group consisting of Au, Ag, Al, Cu, W, Si, Rh, and Ru, or an alloy thereof.

5. The semiconductor device according to claim 1, wherein the metal bonding structure is made of Au or an Au alloy.

6. The semiconductor device according to claim 1, wherein the metal bonding structure further comprises:
    a third metal layer having an upper surface that directly contacts a lower surface of the first metal layer, and
    a fourth metal layer having a lower surface that directly contacts an upper surface of the second metal layer,
    wherein the third metal layer and the fourth metal layer of the metal bonding structure have a same thickness, and
    wherein the thickness of the first and second metal layers is greater than the thickness of the third and fourth metal layers.

7. The semiconductor device according to claim 6, wherein a lower surface of the third metal layer directly contacts an upper surface of the fourth metal layer.

8. The semiconductor device according to claim 1,
    wherein the metal bonding structure comprises the first metal layer, the second metal layer, and a third metal layer, but no further metal layers, and
    wherein the third metal layer has an upper surface that directly contacts a lower surface of the first metal layer, and a lower surface that directly contacts an upper surface of the second metal layer.

9. A manufacturing method for a semiconductor device, comprising:
    disposing a semiconductor element on an upper surface of an insulating substrate;
    forming a first metal layer on a lower surface of the substrate;
    forming a second metal layer having an area larger than an area of the lower surface of the substrate, on an upper surface of a heat dissipation member; and
    contacting the first metal layer and the second metal layer to bond the first metal layer to the second metal layer, thereby forming a multilayered metal bonding structure that includes the first metal layer and the second metal layer, wherein the first metal layer and the second metal layer have a same thickness, and wherein a thickness of the metal bonding structure is in a range of 20 nm to 200 nm,
    wherein a heat conductivity of the metal bonding structure is higher than a heat conductivity of the heat dissipation member,
    wherein the metal bonding structure includes at least a metal selected from a group consisting of Au, Ag, Al, Cu, W, Si, Rh, and Ru, or an alloy thereof, and
    wherein the forming the first metal layer, forming the second metal layer, and the contacting the first metal layer and the second metal layer are performed in a vacuum chamber.

10. The manufacturing method according to claim 9,
    wherein the metal bonding structure is made of a metal material having a melting point of 350 degrees Celsius or higher.

11. The manufacturing method according to claim 9,
    wherein, in the forming the first metal layer and in the forming the second metal layer, the first metal layer and the second metal layer are formed using a sputtering method.

12. The manufacturing method according to claim 9,
    wherein the first metal layer and the second metal layer are formed of a same metal material, and
    wherein the forming the first metal layer and the forming the second metal layer are performed at the same time.

13. A manufacturing method for a semiconductor device, comprising:
    disposing a semiconductor element on an upper surface of an insulating substrate;
    forming a first metal layer on a lower surface of the substrate;
    forming a second metal layer having an area larger than an area of the lower surface of the substrate, on an upper surface of a heat dissipation member; and contacting the first metal layer and the second metal layer to bond the first metal layer to the second metal layer, thereby forming a multilayered metal bonding structure that includes the first metal layer and the second metal layer, wherein the first metal layer and the second metal layer have a same thickness, and wherein a thickness of the metal bonding structure is in a range of 20 nm to 200 nm, wherein a heat conductivity of the metal bonding structure is higher than a heat conductivity of the heat dissipation member, wherein a surface of the first metal layer and a surface of the second metal layer are made of Au or an Au alloy, and wherein the contacting the first metal layer and the second metal layer is performed in air.

14. The manufacturing method according to claim 13, wherein the metal bonding structure is made of a metal material having a melting point of 350 degrees Celsius or higher.

15. The manufacturing method according to claim 13, wherein, in the forming the first metal layer and in the forming the second metal layer, the first metal layer and the second metal layer are formed using a sputtering method.

16. The manufacturing method according to claim 13, wherein the first metal layer and the second metal layer are formed of a same metal material, and wherein the forming the first metal layer and the forming the second metal layer are performed at the same time.

* * * * *